(12) United States Patent
Calmel et al.

(10) Patent No.: US 7,545,212 B2
(45) Date of Patent: Jun. 9, 2009

(54) CLASS AD AUDIO AMPLIFIER

(75) Inventors: Pierre-Emmanuel Calmel, Versailles (FR); Fabrice Robert, Montigny le Bretonneux (FR)

(73) Assignee: Devialet, Paris (FR)

( * ) Notice: Subject to any disclaimer, the term of this patent is extended or adjusted under 35 U.S.C. 154(b) by 0 days.

(21) Appl. No.: 11/658,324

(22) PCT Filed: Jul. 25, 2005

(86) PCT No.: PCT/FR2005/001927

§ 371 (c)(1),
(2), (4) Date: Jan. 24, 2007

(87) PCT Pub. No.: WO2006/024739

PCT Pub. Date: Mar. 9, 2006

(65) Prior Publication Data

US 2008/0088375 A1    Apr. 17, 2008

(30) Foreign Application Priority Data

Jul. 30, 2004    (FR) .................................. 04 08473

(51) Int. Cl.
*H03F 3/217*    (2006.01)

(52) U.S. Cl. .................................... 330/251; 330/207 A
(58) Field of Classification Search .................. 330/10, 330/207 A, 251
See application file for complete search history.

(56) References Cited

U.S. PATENT DOCUMENTS

| | | | |
|---|---|---|---|
| 3,970,953 A | 7/1976 | Walker et al. | 330/99 |
| 4,107,619 A | 8/1978 | Pass | 330/255 |
| 6,396,933 B1 | 5/2002 | Jung et al. | 381/96 |
| 6,937,095 B2 * | 8/2005 | Joffe | 330/251 |

* cited by examiner

*Primary Examiner*—Steven J Mottola
(74) *Attorney, Agent, or Firm*—Young & Thompson

(57) ABSTRACT

An amplifier includes an output for feeding a load, a voltage generator presenting very high linearity and very low output impedance, and a current source having its output connected to the output of the voltage generator at a coupling point connected to the output. The output of the voltage generator is connected directly to the coupling point without any resistive element being interposed between them. A control stage controls the current source from the current delivered by the voltage generator. The control stage for controlling the current source includes current measurement elements for measuring the current delivered by the voltage generator, and the elements are disposed solely upstream from the output for feeding the load.

16 Claims, 2 Drawing Sheets

CLASS AD AUDIO AMPLIFIER

BACKGROUND OF THE INVENTION

1. Field of the Invention

The present invention relates to a high fidelity audio amplifier with low distortion and very high efficiency, the amplifier comprising:

an output for feeding a load;

a voltage generator presenting very high linearity and very low output impedance;

a current source having its output connected to the output of the voltage generator at a coupling point connected to the output, the output of the voltage generator being connected directly to the coupling point without any resistive element being interposed between them; and a control stage for controlling the current source from the current delivered by the voltage generator.

2. Description of the Related Art

Distortion and efficiency are characteristics that are important for an audio amplifier.

It is known that the distortion of a linear voltage amplifier is relatively low. An amplifier of that type is referred to as "class A" or "class AB". Such a structure is used for very up-market amplifiers. Nevertheless, the efficiency of such amplifiers is poor, being of the order of 25% to 70%.

Conversely, amplifiers of class D, using pulse-width modulation (PWM) have very good efficiency. They are constituted by so-called digital amplifiers making use of switch elements. Efficiency lies in the range 95% to 98%.

Such amplifiers are not very linear since they make use of inductors and they thus present a high level of distortion leading to audio performance that is mediocre.

In an attempt to combine the advantages of those two types of amplifier, i.e. to obtain good efficiency with low distortion, it is known to couple a class A amplifier with a class D amplifier so as to form a class AD amplifier.

Thus, a voltage amplifier presenting low output impedance and low distortion factor is coupled with a current amplifier having high efficiency.

One such solution is described in U.S. Pat. No. 6,407,619, for example. That patent describes coupling a voltage generator with a current generator, the current generator operating in an open loop outside the negative feedback loop of the voltage generator.

The current generator is servo-controlled from a measurement of the total current delivered by both generators, such that the current delivered by the current generator is 5 to 20 times greater than that delivered by the voltage generator. The coupling between the two generators is direct in order to reduce the distortion of the system.

The distortion of the amplifier described is low, but its efficiency is not very high.

This limited efficiency can be explained in particular because the voltage generator does not present high efficiency in order to be able to obtain low output impedance, and also by the presence of resistance in the circuit connecting the load to ground, which leads to a phase shift in the current when the load is not purely resistive, as is the case of a loudspeaker. This leads to a degradation in the damping factor of the amplifier.

Since the current generator is operating in an open loop, its gain is relatively inaccurate, and furthermore the phase shift in the current measurement implies that the current generator must present gain that is significantly lower than 1 in order to ensure that the system is stable. The gain limitation restricts the current ratio between the two generators to values lying in the range 5 to 20.

Finally, the relatively high resistance resistor connected in series with the current generator greatly degrades efficiency.

BRIEF SUMMARY OF THE INVENTION

An object of the invention is thus to provide an audio amplifier possessing simultaneously excellent linearity, i.e. low distortion, very low output impedance, and very good efficiency.

To this end, the invention provides an amplifier of the above-specified type, characterized in that the control stage for controlling the current source includes current measurement means for measuring the current delivered by the voltage generator, which means are disposed solely upstream from the output for feeding the load.

The invention also provides a voltage amplifier output stage, characterized in that it comprises a transistor forming a voltage source, a driver unit connected to the base of the transistor to control it, and an amplifier as described above having its output connected to the transistor forming the voltage source, which transistor constitutes the load fed by the amplifier.

In particular embodiments, the output stage may include one or more of the following characteristics:

the voltage generator comprises a transistor connected between a power supply voltage and an input of the transistor forming the voltage source, and a voltage source suitable for keeping constant the voltage between the base of the transistor and the output of the transistor forming a voltage source, and the current measurement means for measuring the current delivered by the voltage generator are interposed between the power supply voltage and the transistor;

the current measurement means comprise a measurement resistor;

the control stage comprises a hysteresis comparator having its inputs connected to the terminals of the measurement resistor, and the current source comprises a switch member connected in series with an inductor between the power supply voltage and the output for feeding the load, which switch member is controlled by the output of the hysteresis comparator, a freewheel diode connecting the power supply voltage to the point of connection between the switch member and the inductor; and the thresholds of the hysteresis comparator are such that the root mean square (rms) current delivered by the current source is at least ten times greater than the rms current flowing through the voltage generator.

Finally, the invention also provides an audio amplifier, characterized in that the output for feeding the load is suitable for feeding an electro-acoustic loudspeaker.

In particular embodiments, the audio amplifier includes one or more of the following characteristics:

said voltage generator includes an output stage as described above;

the output impedance of the voltage generator is less than 0.2 ohms ($\Omega$);

the control stage of the current source comprises a negative feedback loop having its upstream end connected to the output for feeding the load, and the means for measuring the current delivered by the voltage generator are integrated in the negative feedback loop;

said means for measuring the current delivered by the voltage generator comprise means for measuring the current delivered by the current source and means for measuring the total current delivered to the load from the output for feeding the load, and means for determining the current delivered by the voltage generator on the basis of the current delivered by the current source and the total current delivered to the load from the output for feeding the load;

the means for measuring the current delivered by the current source are disposed between the current source and the common output point;

the means for measuring the current delivered to the load from the output for feeding the load are disposed between the coupling point and the output for feeding the load;

the control stage for controlling the current source includes means for integrating the control signal; and the current source is pulse width modulated, and the control stage of the current source includes means for delaying the control signal.

BRIEF DESCRIPTION OF THE DRAWING FIGURES

The invention can be better understood on reading the following description given purely by way of example and making reference to the drawings, in which.

DETAILED DESCRIPTION OF THE PREFERRED EMBODIMENTS

Figure 1:
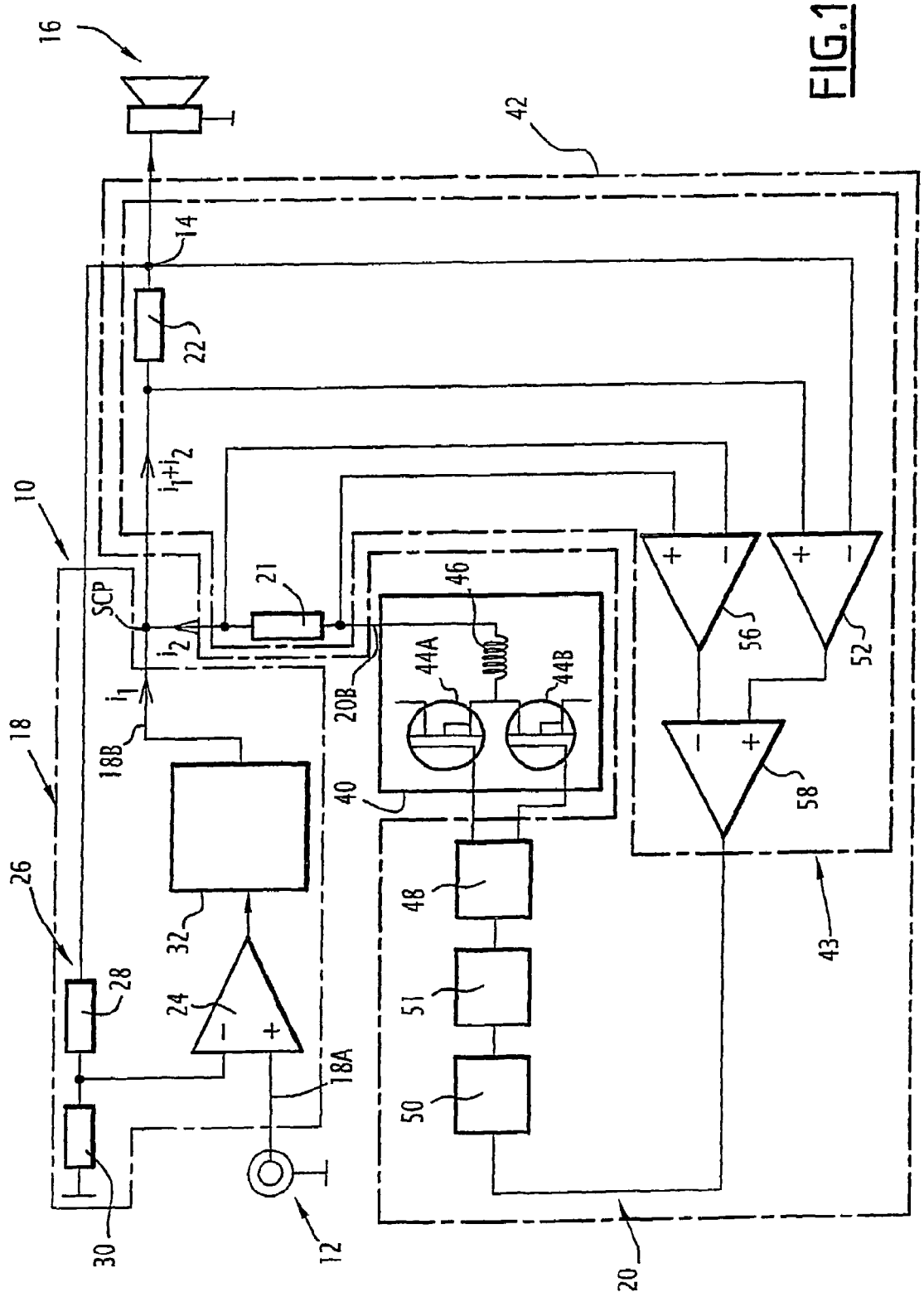
FIG. 1 is a circuit diagram of an amplifier of the invention.

The audio amplifier 10 shown in FIG. 1 has an input 12 for receiving an audio signal to be amplified and an output 14 to which there is connected to a load constituted by a loudspeaker 16. The load 16 is connected between the output 14 of the amplifier and ground, directly, i.e. without any other elements presenting resistance.

The input 12 of the amplifier is suitable for receiving a control voltage referenced relative to ground.

The amplifier is of class AD. Thus, it comprises a voltage generator 18 coupled to a current generator 20. These generators deliver respective currents $i_1$ and $i_2$.

The voltage generator 18 presents an input 18A directly connected to the input 12 of the amplifier. The output from the voltage generator, referenced 18B, is connected to the output of the current generator, referenced 20B, at a coupling point marked SCP via a resistor 21 for measuring the current $i_2$ delivered by the current generator.

The two outputs 18B and 20B of the voltage generator 18 and of the current generator 20 are connected to the output 14 of the amplifier solely via a resistor 22 for measuring the total output current $i_1+i_2$ from the amplifier. Each of the resistors 21 and 22 typically has a resistance of about 0.1 Ω and they are integrated in a control loop for the current generator 20, as described below.

The voltage generator 18 comprises a voltage amplifier stage 24 represented by a differential amplifier having its non-inverting input connected to the input 18A and its inverting input connected to a negative feedback loop 26 made up of two resistors 28 and 30 connected in series between the output 14 of the amplifier and ground.

These two resistors form a voltage divider bridge. The inverting input from the differential amplifier 24 is connected to the midpoint of the voltage divider bridge, i.e. between the resistors 28 and 30.

By way of example, the voltage amplifier stage 24 is made up of a succession of amplifier stages. Between the power amplifier stage 24 and the output 18B there is provided an output stage 32 of the cascode type. This stage is shown in detail in FIG. 2 and is described below.

The output impedance of the voltage generator 18 is very low, and for example is about 0.025 Ω. It is well below 0.20 Ω. The voltage generator 18 possesses very good linearity.

The current generator 20 is of the PWM type, i.e. of the pulse width modulation type. It presents high efficiency.

The current generator essentially comprises a current source 40 and a control loop 42 for controlling the current source. This control loop 42 includes means 43 for measuring the current $i_1$ output by the voltage generator 18.

In conventional manner, the current source 40 comprises two power transistors 44A and 44B forming power switch elements fed from two opposite voltages V+ and V−, having their outputs connected together to one terminal of an inductor 46 whose other terminal constitutes the output 20B of the current generator.

The control grids of the two transistors 44A and 44B are connected to a control unit 48 integrated in the control loop 42. Going from the output of the means 43 for measuring the current $i_1$ output by the generator 18, the control loop comprises: signal delay means 50; and then integrator means 51. In some cases, the means 51 can be constituted by the inductor 46.

The measurement means 43 comprise means for measuring the total current $i_1+i_2$ output by the amplifier, and means for measuring the current $i_1$ delivered by the current generator 20.

More precisely, the means for measuring the total current $i_1+i_2$ comprise a resistor 22 connected in series between the output 14 of the amplifier and the coupling point SCP between the two generators. Furthermore they include a differential amplifier 52 whose two inputs are connected to the terminals of the resistor 22.

The means for measuring the current $i_2$ output by the current generator comprise the resistor 21 connected in series between the output of the current source 40 and the output 20B of the current generator, i.e. ahead of the connection between the current generator and the voltage generator at the coupling point SCP. A differential amplifier 56 has its inputs connected to the terminals of the resistor 21 in order to output information representative of the current $i_2$ output by the current generator 20.

The outputs of the differential amplifiers 52 and 54 are connected to the two inputs of a differential amplifier 58 suitable for outputting information representative of the current $i_1$ delivered at the output from the voltage generator 18.

Figure 2:
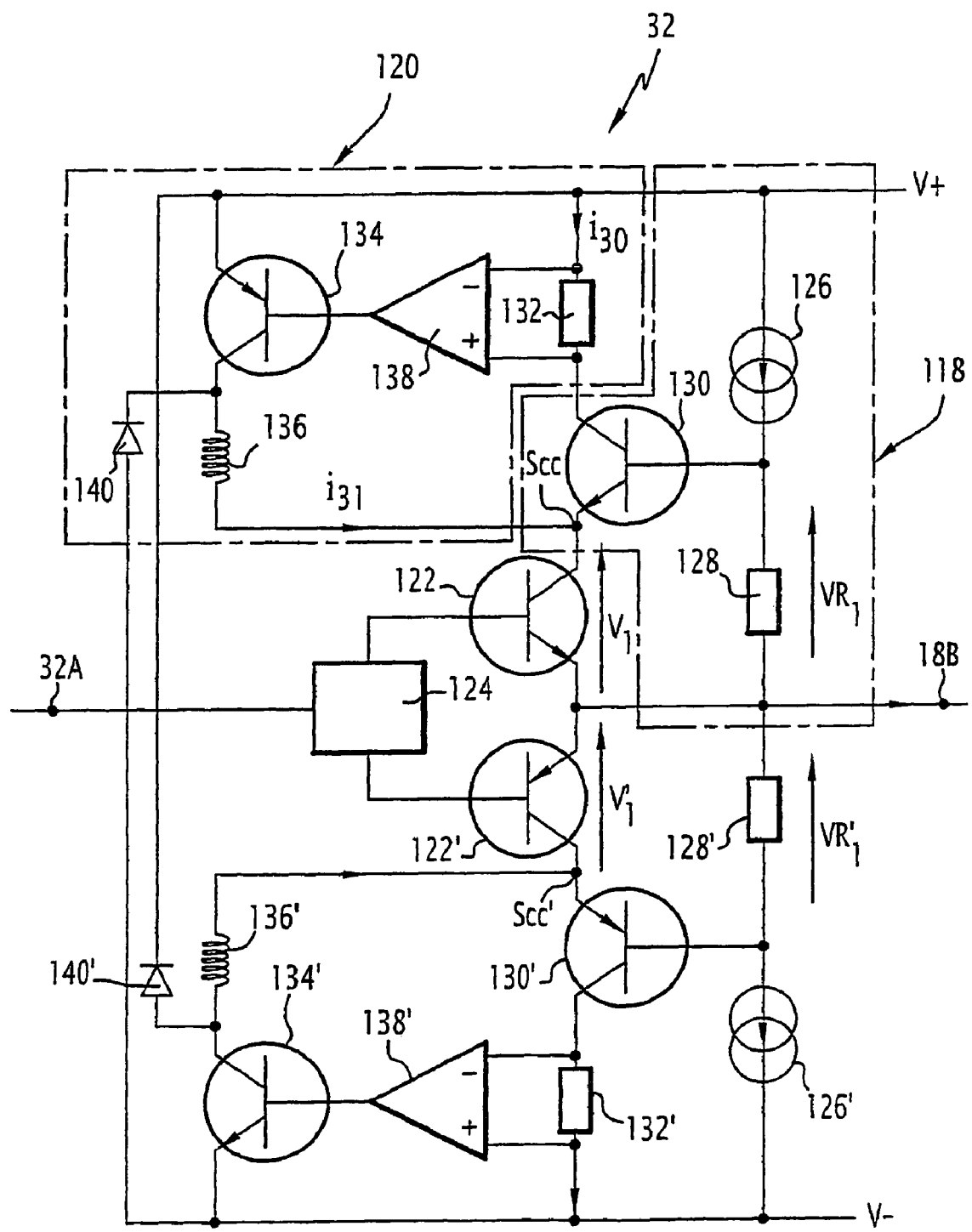
FIG. 2 is a view on a larger scale of the output stage of the voltage generator used in the FIG. 1 amplifier.

The output stage 32 of the voltage generator 18 shown in FIG. 2 constitutes a symmetrical circuit fed by the opposite voltages V+ and V−, each half of the circuit being suitable for generating a voltage of a predetermined sign.

Because of the symmetry of the circuit, only the top half of the circuit is described in detail, with the elements constituting it being designated by reference numerals, while the corresponding elements of the bottom half of the circuit are designated by the same reference numerals followed by the "prime" symbol.

The output stage 32 is constituted by a voltage generator 118 integrated in a cascode type circuit, and a current source 120 directly coupled to the voltage generator. The current source 120 operates in variable-frequency pulse-width mode servo-controlled on the current $i_{30}$ passing through the voltage generator 118, in such a manner as to ensure said current remains constant.

Furthermore, the output stage 32 includes a transistor 122 having its emitter connected directly to the output 18B of the stage 32. The base of the transistor 122 is connected to a driver unit 124, itself connected to the input referenced 32A of the output stage. The driver unit 124 is suitable for receiving the signal to be amplified and for driving the transistor 122 so that the voltage between the emitter of said transistor and ground is representative of the voltage at the input 32A.

In the cascode circuit, the voltage generator 118 includes a current generator 126 associated with a resistor 128 and with a transistor 130 connected in a common emitter configuration. More precisely, the transistor 130 has its emitter connected to the collector of the transistor 122, and has its collector connected to the power supply voltage V+ via a resistor 132 for measuring the voltage source current $i_{30}$.

The current generator 126 is connected in series with the resistor 128 between the power supply V+ and the output 18B of the output stage. The base of the transistor 130 is connected between the output of the current generator 126 and the resistor 128, the base of the transistor 130 thus being connected to the output 18B solely via the resistor 128. The current generator 126 is suitable for delivering constant current through the resistor 128.

In this arrangement, the transistor 130 forms a voltage generator co-operating with the current source 120 that is coupled thereto to feed the load constituted by the transistor 122.

The current source 120 includes a transistor 134 having its emitter connected to the power supply voltage V+ and its collector connected to the collector of the transistor 122 via a coil 136. The base of the transistor 134 is connected to the output of a hysteresis comparator 138 having two thresholds referenced $V_a$ and $V_b$. The two inputs of the comparator 138 are connected to the two terminals of the measurement resistor 132.

Finally, a freewheel diode 140 has its cathode connected between the collector of the transistor 134 and the coil 136, and its anode connected to the negative power supply voltage V−.

The operation of the output stage 32 is described initially, and then the operation of the entire amplifier is described.

In the voltage generator 118 integrated in the cascode circuit, the current source 126 generates a constant current through the resistor 128. Thus, the voltage written $VR_1$ across the terminals of the resistor 128 is constant. This voltage is applied to the base of the transistor 130 connected in a common emitter configuration.

The voltage written $V_1$ between the emitter and the collector of the transistor 122 is equal to the constant voltage $VR_1$ across the terminals of the resistor minus the likewise constant voltage between the base and the emitter of the transistor 130. Thus, the voltage $V_1$ is constant. The transistor 122 thus operates with a constant collector-emitter voltage, such that its gain characteristics and its parasitic collector-base capacitance are constant.

For the current source 120, the resistor 132 serves to measure the current referenced $i_{30}$ that flows through the transistors 130 and 122. The voltage across the terminals of the resistor 132 is directly proportional to the current $i_{30}$ passing therethrough. This voltage is compared with the two thresholds $V_a$ and $V_b$ of the hysteresis comparator 138.

The thresholds of the hysteresis comparator are such that the rms current $i_{31}$ delivered by the current source 120 is at least ten times greater than the rms current $i_{30}$ flowing through the voltage generator 130.

When the voltage across the terminals of the resistor 132 exceeds the high threshold $V_a$ set by the comparator, the transistor 134 is conductive. The inductor 136 is subjected to a potential difference equal to the power supply voltage V+ minus the output voltage written $V_{SCC}$. Thus, the current written $i_{31}$ flowing through the inductor 136 and delivered to the point SCC between the transistors 130 and 122 increases with a slope (V+−$V_{SCC}$) divided by $L_1$ where $L_1$ is the inductance of the inductor 136. Since the current consumed by the transistor 122 remains constant, the current $i_{30}$ flowing through the transistors 130, 122 decreases until it reaches the low threshold $V_b$ of the hysteresis comparator 138. When the low threshold $V_b$ is reached, the transistor 134 ceases to conduct and the inductor 136 continues to deliver current $i_{31}$ via the freewheel diode 140, the current $i_{31}$ flowing through the transistors 122' and 130' (?). The current $i_{31}$ flowing through the inductor 136 decreases as the energy stored in the inductor is consumed.

The current $i_{30}$ then increases to compensate for the decrease in the current $i_{31}$ until the high threshold $V_a$ is reached. The above-described process then begins again.

Under such conditions, the current source 120. operates with variable frequency pulse width modulation (PWM) servo-controlled on the current flowing through the resistor 132 so that the mean value of the current 130 remains constant.

At the node SCC, the voltage generator 118 in the form of a cascode circuit is coupled directly to the PWM type current source 120 so that the majority of the energy is delivered by the current source 120 without disturbing the operation of the cascode circuit.

The structure described above for the output stage 32 serves to increase the bias current of the transistors 122 and 122' without significantly impacting the efficiency of the amplifier. The voltage between the collector and the emitter of the transistor 122 or 122' is constant and small. It is typically of the order of 3 volts (V).

For example, if the power supply voltage V+ is equal to 40 V and the current $i_{30}$ delivered by the voltage generator 118 is equal to 10 milliamps (mA), while the current $i_{31}$ delivered by the current source 120 is equal to 990 mA, with an efficiency of 95% for the current generator 120, the bias current of 1 amp (A) leads to dissipation of only 3×1=3 watts (W) in the transistor 122 and of 37×0.01=0.37 W in the transistor 130 and to 0.990×37×(1−0.95)=1.8 W in the transistor 134 and the diode 140, giving a total of about 5 W.

The traditional cascode circuit having no current generator 120, and under the same thermal dissipation conditions would have led to a bias current of 5/40=125 mA only, i.e. about one-eighth that of the circuit described above.

Increasing the bias current for unchanging thermal dissipation makes it possible to reduce very significantly the output impedance of the amplifier. In the above example, the output impedance is only 0.025 Ω instead of 0.2 Ω, i.e. an improvement by a factor of 8.

Concerning the audio amplifier overall as shown in FIG. 1, the direct coupling between the coupling point SCP between the voltage generator 18 and the current source 20 without any resistance being interposed between the coupling point and the voltage source, or between ground and the load, means that the current delivered by the voltage generator can be measured by measuring the total current $i_1+i_2$, which measurement is performed within the negative feedback loop of the current source.

In the amplifier as described, the current generator 20 operates in a closed loop, error being determined by the measurement means 43 with unity return gain. The measurement means 43 coupled to the integrator function implemented by the means 51 or 46 lead to open loop gain that is infinite for direct current (DC), and consequently to close loop gain that is strictly equal to unity at zero frequency.

Consequently, the following equation applies:

$$i_z = i_1 + i_2$$

$$i_2 = i_z$$

from which it can be deduced that $i_1 = 0$.

Thus, all of the current, and thus all of the power is delivered by the high-efficiency current generator 20 while the voltage generator 18 merely imposes the output voltage without delivering any current.

Thus, current ratios can reach several hundreds with the structure described above and can do so up to frequencies of several tens of kilohertz (kHz).

In practice, the voltage source 18 is real and thus not perfect. It presents an output impedance RV1 that is not zero.

RV1 represents the output resistance of the voltage generator and any parasitic impedance connected in series between the voltage generator and the current source.

The voltage generator is characterized by a gain Gv(p) and by a series resistance RV1.

The differential amplifier 24 constituted by the stage 32 is characterized by a gain Ga1(p), which in practice is generally of the first-order lowpass type.

To a first approximation the impedance $$Z1 = \frac{V1}{I1}$$

is given by:

$$Z1 = \frac{RV1}{1 + \text{Ga1}(p) \times Gv(p) \times \frac{R2}{R1 + R2}}$$

and Z1 increases with frequency tending towards RV1, since Ga1(p) and Gv(p) tend towards 0 with increasing p.

Any distortion in $i_2$ leads to an error current which is shared between the impedance Z of the load 16, i.e. the loudspeaker, and the impedance Z1 of the voltage generator.

The current $i_z$ flowing through the load 16 is given by:

$$i_z = (i_1 + i_2)_{error} = i_{2error} \times \frac{Z1}{Z1 + Z}$$

Error current rejection can thus be written as follows:

$$\nabla_{dB} = 20 \times \log\left(\frac{Z1 + Z}{Z1}\right)$$

and since Z1<<Z $$\nabla_{dB} \approx 20 \times \log\left(\frac{Z}{Z1}\right)$$

Furthermore, since:

$$\lim_{p \to \infty} \nabla_{dB} \approx 20 \times \log\left(\frac{Z}{RV1}\right)$$

it is essential for the voltage amplifier to present output impedance that is as low as possible in the audio band so that the improvement in the total harmonic distortion (THD) is as great as possible. This means that there must not be any resistance in series between the voltage amplifier and the current amplifier and also that the voltage amplifier presents an open loop output impedance that is very low.

EXAMPLE

Consider a loudspeaker having an impedance of 8 Ω (Z=8 Ω) and a traditional amplifier having an open loop output impedance of 0.2 Ω; and an amplifier using the new structure for its output stage, with impedance of 0.025 Ω.

The improvement in THD tends towards 20×log(8/0.2)=32 dB for a traditional amplifier and towards 20×log(8/0.025) =50 dB for an amplifier using the novel structure in its output stage.

Inserting a resistance of 1 Ω in series between the voltage amplifier and the current amplifier would degrade distortion rejection to a value of 20×log(8/1.02)=16 dB, leading to poor THD results.

The very high efficiency PWM type current source 40 delivers all of the energy that is delivered to the load.

Writing the value of the delay 50 as τ, the oscillation frequency of the current source 40 is determined solely by the smaller of the following two values:

$$f_0 = \frac{1}{4 \cdot \tau}$$

$$f_1 \text{ such that } \text{Arg}\left(\frac{1}{\frac{1}{Z(f_1)} + \frac{1}{Z1(f_1)}}\right) + \tau \times 2 \times \pi \times f_1 = \frac{\pi}{2}$$

Because of the new structure for the output stage of the voltage generator and because of the direct coupling, Z1 has a modulus that is very small, so $f_1$ is a frequency that is very high, greater than 5 megahertz (MHz). In practice, it is thus the delay τ that sets the operating frequency of the system so that it is independent of the load 16.

Since all of the energy delivered to the load comes from the current generator, the efficiency of the system is determined for the most part by the efficiency of the current source. The losses of the system are constituted solely by:

switching losses in the transistors 44A, 44B;

bias losses at rest in the voltage generator, that are very greatly reduced for a given output impedance by the new structure for the output stage as described with reference to FIG. 2; and losses associated with the non-linearities of the PWM current source.

The amplifier thus presents the following characteristics:
very high efficiency;

very low output impedance; and
very good linearity.

The invention claimed is:

1. An amplifier comprising:
an output for feeding a load;
a voltage generator presenting very high linearity and very low output impedance;
a current source having its output connected to the output of the voltage generator at a coupling point connected to the output, the output of the voltage generator being connected directly to the coupling point without any resistive element being interposed between them; and
a control stage for controlling the current source from the current delivered by the voltage generator;
wherein the control stage for controlling the current source includes current measurement means for measuring the current delivered by the voltage generator, which means are disposed solely upstream from the output for feeding the load.

2. A voltage amplifier output stage, comprising a transistor forming a voltage source, a driver unit connected to the base of the transistor to control it, and an amplifier according to claim 1 having its output connected to the transistor forming the voltage source, which transistor constitutes the load fed by the amplifier.

3. An output stage according to claim 2, wherein the voltage generator comprises a transistor connected between a power supply voltage and an input of the transistor forming the voltage source, and a voltage source suitable for keeping constant the voltage between the base of the transistor and the output of the transistor forming a voltage source, and wherein the current measurement means for measuring the current delivered by the voltage generator are interposed between the power supply voltage and the transistor.

4. An output stage according to claim 3, wherein the current measurement means comprise a measurement resistor.

5. An output stage according to claim 4, wherein the control stage comprises a hysteresis comparator having its inputs connected to the terminals of the measurement resistor, and the current source comprises a switch member connected in series with an inductor between the power supply voltage and the output for feeding the load, which switch member is controlled by the output of the hysteresis comparator, a freewheel diode connecting the power supply voltage to the point of connection between the switch member and the inductor.

6. An output stage according to claim 5, wherein the thresholds of the hysteresis comparator are such that the rms current delivered by the current source is at least ten times greater than the rms current flowing through the voltage generator.

7. An amplifier according to claim 1, wherein the output for feeding the load is suitable for feeding an electro-acoustic loudspeaker.

8. An amplifier according to claim 7, wherein said voltage generator includes an output stage comprising a transistor forming a voltage source, a driver unit connected to the base of the transistor to control it, and the amplifier having its output connected to the transistor forming the voltage source, the transistor constituting the load fed by the amplifier.

9. An amplifier according to claim 7, wherein the output impedance of the voltage generator is less than 0.2 Ω.

10. An amplifier according to claim 7, wherein the control stage of the currant source comprises a negative feedback loop having its upstream end connected to the output for feeding the load, and wherein the means for measuring the current delivered by the voltage generator are integrated in the negative feedback loop.

11. An amplifier according to claim 7, wherein said means for measuring the current delivered by the voltage generator comprise means for measuring the current delivered by the current source and means for measuring the total current delivered to the load from the output for feeding the load, and means for determining the current delivered by the voltage generator on the basis of the current delivered by the current source and the total current delivered to the load from the output for feeding the load.

12. An amplifier according to claim 11, wherein the means for measuring the current delivered by the current source are disposed between the current source and the common output point.

13. An amplifier according to claim 11, wherein the means for measuring the current delivered to the load from the output for feeding the load are disposed between the coupling point and the output for feeding the load.

14. An amplifier according to claim 7, wherein the control stage for controlling the current source includes means for integrating the control signal.

15. An amplifier according to claim 7, wherein the current source is pulse-width modulated, and wherein the control stage of the current source includes means for delaying the control signal.

16. An amplifier according to claim 1, wherein the amplifier is an audio amplifier.

* * * * *